United States Patent
Bhat et al.

(10) Patent No.: US 7,115,929 B2
(45) Date of Patent: Oct. 3, 2006

(54) SEMICONDUCTOR CONSTRUCTIONS COMPRISING ALUMINUM OXIDE AND METAL OXIDE DIELECTRIC MATERIALS

(75) Inventors: Vishwanath Bhat, Boise, ID (US); F. Daniel Gealy, Kuna, ID (US); Cancheepuram V. Srividya, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/822,062

(22) Filed: Apr. 8, 2004

(65) Prior Publication Data
US 2005/0224913 A1   Oct. 13, 2005

(51) Int. Cl.
*H01L 29/72* (2006.01)
(52) U.S. Cl. .............. 257/296; 257/303; 257/306; 257/310; 257/532
(58) Field of Classification Search .......... 257/296, 257/308, 309, 310, 311, 532, 303, 306
See application file for complete search history.

(56) References Cited

U.S. PATENT DOCUMENTS 6,831,315 B1 * 12/2004 Raaijmakers et al. ....... 257/296

| | | |
|---|---|---|
| 2002/0115252 A1 | 8/2002 | Haukke et al. |
| 2002/0195683 A1 * | 12/2002 | Kim et al. ............... 257/532 |
| 2004/0233610 A1 | 11/2004 | Basceri et al. |
| 2004/0238872 A1 * | 12/2004 | Lee et al. ............... 257/306 |

* cited by examiner

Primary Examiner—Edward Wojciechowicz
(74) Attorney, Agent, or Firm—Wells St. John P.S.

(57) ABSTRACT

The invention includes constructions having two dielectric layers over a conductively-doped semiconductive material. One of the dielectric layers contains aluminum oxide, and the other contains a metal oxide other than aluminum oxide (such metal oxide can be, for example, one or more of hafnium oxide, tantalum oxide, titanium oxide and zirconium oxide). The layer containing aluminum oxide is between the layer containing metal oxide and the conductively-doped semiconductive material. The invention includes capacitor devices having one electrode containing conductively-doped silicon and another electrode containing one or more metals and/or metal compounds. At least two dielectric layers are formed between the two capacitor electrodes, with one of the dielectric layers containing aluminum oxide and the other containing a metal oxide other than aluminum oxide. The invention also includes methods of forming capacitor constructions.

22 Claims, 4 Drawing Sheets

SEMICONDUCTOR CONSTRUCTIONS COMPRISING ALUMINUM OXIDE AND METAL OXIDE DIELECTRIC MATERIALS

TECHNICAL FIELD

The invention pertains to devices comprising aluminum oxide and metal oxide dielectric materials, and in particular aspects pertains to capacitor constructions. The invention also pertains to methods of forming capacitor constructions.

BACKGROUND OF THE INVENTION

Dielectric materials are utilized in numerous devices associated with semiconductor constructions, including, for example, capacitors. A continuing goal in semiconductor device fabrication is to decrease the footprint consumed by the devices while maintaining, and preferably improving, performance of the devices. In an effort to achieve such goal, various new compositions have been developed which can be incorporated into integrated circuit device constructions. It is frequently challenging to utilize the compositions in semiconductor constructions, in that the compositions can create undesired and unexpected problems.

In the specific case of capacitor constructions, it is frequently desired to utilize a dielectric material having a high dielectric constant so that a thin layer of the material can provide desired capacitance. However, another goal in capacitor device fabrication is to avoid current leakage through a capacitor dielectric material to electrodes adjacent to the material. It is frequently difficult to accomplish both goals simultaneously, and it is therefore desired to develop a dielectric that can address both goals simultaneously.

SUMMARY OF THE INVENTION

In one aspect, the invention includes a device associated with a semiconductor substrate. The device comprises an electrical node supported by the semiconductor substrate and containing conductively-doped semiconductive material. The device further includes a first dielectric material comprising aluminum oxide and a second dielectric material comprising a metal oxide other than aluminum oxide. The first dielectric material is between the second dielectric material and the conductively-doped semiconductive material.

In one aspect, the invention includes a method of forming a capacitor construction. A semiconductor substrate is provided, and a first capacitor electrode is formed over the substrate. The first capacitor electrode comprises conductively-doped silicon. A first dielectric layer is formed over and in physical contact with the conductively-doped silicon of the first capacitor electrode. The first dielectric layer comprises aluminum oxide. A second dielectric layer is formed over the first dielectric layer. The second dielectric layer comprises a metal oxide other than aluminum oxide. A second capacitor electrode is formed over and in physical contact with the second dielectric layer. The second capacitor electrode comprises one or more metals which can be in elemental form and/or in the form of metal compounds.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Among the compositions which have been developed for utilizationas capacitor dielectric materials are metal oxides, such as, for example, aluminum oxide, hafnium oxide, titanium oxide, zirconium oxide and tantalum oxide. Hafnium oxide, tantalum oxide and zirconium oxide can be particularly desired, in that such oxides have relatively high dielectric constants. However, one aspect of the invention is a recognition that if hafnium oxide, tantalum oxide and/or zirconium oxide is provided directly against a conductively-doped semiconductor material (such as, for example, conductively-doped silicon), current leakage can occur between the dielectric material and the conductively-doped semiconductor material. If an appropriate intervening (barrier) material is provided between the conductively-doped semiconductor material and the dielectric material comprising hafnium oxide, tantalum oxide and/or zirconium oxide, the leakage current can be reduced.

One aspect of the invention is a recognition that an appropriate material to provide between the conductively-doped semiconductive material and the dielectric comprising hafnium oxide, tantalum oxide, and/or zirconium oxide is aluminum oxide. Even though aluminum oxide has a dielectric constant less than that of hafnium oxide, tantalum oxide and zirconium oxide, and therefore can be less desired than hafnium oxide, tantalum oxide and zirconium oxide in applications in which high dielectric constants are desired (such as, for example, capacitor applications), the aluminum oxide has the desired property of reducing leakage to the conductively-doped semiconductive material.

As a specific example, hafnium oxide has a higher dielectric constant (about 22) than aluminum oxide (about 9). However, the thermal stability of hafnium oxide is not as good as aluminum oxide, and also the leakage is higher for hafnium oxide compared to aluminum oxide. One aspect of the invention is to take advantage of the higher dielectric constant of hafnium oxide and the lower leakage of aluminum oxide by utilizing laminates of aluminum oxide and hafnium oxide to decrease the leakage and increase the hafnium oxide thermal stability. The laminates are aluminum oxide/hafnium oxide bilayers rather than trilayers or other multilayer stacks. An aluminum oxide/hafnium oxide bilayer can be more desirable as a dielectric material than a multilayer stack because the fabrication of the bilayer is simpler.

An exemplary aspect of the invention is described with reference to a semiconductor construction 10 in FIG. 1. Construction 10 comprises a semiconductor substrate 12 which can be, in particular aspects of the invention, monocrystalline silicon lightly-doped with background p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A pair of wordlines 14 and 16 extend over substrate 12. Each of the wordlines comprises an electrically insulating gate dielectric 18, an electrically conductive line 20, and an electrically insulating cap 22. Materials 18, 20 and 22 can comprise any suitable materials. Typically, dielectric material 18 would comprise silicon dioxide, conductive material 20 would comprise one or more of conductively-doped silicon, metal, and metal compounds; and insulative cap would comprise silicon nitride. The layers 18, 20 and 22 can be single layers (as shown), or can comprise stacks of layers having appropriate conductivity. For instance, the conductive lines 20 would frequently comprise stacks of conductive layers, such as, for example, stacks containing a layer of conductively-doped silicon, a layer of metal, and a layer of metal compound (such as, for example, metal silicide).

Each of the wordlines 14 and 16 has vertically extending sidewalls, and has sidewall spacers 24 formed along the sidewalls. Sidewall spacers 24 comprise anisotropically-etched insulative material, and can, for example, comprise silicon nitride.

Wordline 16 comprises a transistor gate in the shown construction. Source/drain regions 26 and 28 extend into substrate 12 proximate the gate. The source/drain regions are, conductively-doped regions of substrate 12, and can comprise p-type doped regions or n-type doped regions as known to persons of ordinary skill in the art.

An isolation region 30 is beneath wordline 14, and electrically isolates wordline 14 from source/drain region 26.

An electrically conductive pedestal 32 is provided over source/drain region 26 and in electrical connection with source/drain region 26. Pedestal 32 can comprise any suitable electrically conductive material, or combination of materials, including, for example, metals, metal compounds, and conductively-doped semiconductive materials (such as, for example, conductively-doped silicon).

An electrically conductive material 34 extends over and in electrical connection with conductive pedestal 32. Conductive material 34 can comprise the same composition as at least a portion of pedestal 32, or can comprise a different composition. Conductive material 34 can comprise conductively-doped semiconductive material. The conductively-doped semiconductive material can comprise, consist essentially of, or consist of conductively-doped silicon, such as, for example, conductively-doped polycrystalline silicon, conductively-doped amorphous silicon, and/or conductively-doped monocrystalline silicon.

Conductive material 34 can be considered to be an electrical node supported by substrate 12. Alternatively, conductive regions 26, 32 and 34 can together be considered to be an electrical node supported by substrate 12, or conductive regions 32 and 34 can be considered to be an electrical node.

A first dielectric material 36 is provided over conductive material 34. Dielectric material 36 comprises, consists essentially of, or consists of aluminum oxide.

A second dielectric material 38 is formed over the first dielectric material 36. Second dielectric material 38 comprises a metal oxide other than aluminum oxide, and can comprise, for example, a metal oxide selected from the group consisting of hafnium oxide, tantalum oxide and zirconium oxide. In particular aspects, dielectric material 38 can comprise, consist essentially of, or consist of one or more of hafnium oxide, tantalum oxide and zirconium oxide.

In some aspects, the second dielectric material comprises a stack of dielectric materials, such as, for example, a stack of tantalum oxide and hafnium oxide, or a stack of zirconium oxide and hafnium oxide. Materials 36 and 38 can thus be together incorporated into a stack comprising, in sequential order, aluminum oxide, tantalum oxide and hafnium oxide (i.e., $Al_2O_3/Ta_2O_5/HfO_2$); or aluminum oxide, zirconium oxide and hafnium oxide (i.e., $Al_2O_3/ZrO_2/HfO_2$).

The layers 36 and 38 can be repeated multiple times to form, for example, a stack comprising aluminum oxide, hafnium oxide, aluminum oxide and hafnium oxide (i.e., $Al_2O_3/HfO_2/Al_2O_3/HfO_2$).

Dielectric material 36 can be formed to a thickness of, for example, from about 5 Å to about 60 Å, and in some aspects can be formed to a thickness of, for example, from about 5 Å to about 20 Å. Dielectric material 38 can have a thickness of, for example, from about 20 Å to about 90 Å, and in some aspects can be formed to a thickness of, for example, from about 20 Å to about 60 Å. A combined thickness of layers 36 and 38 can be, for example, from about 25 Å to about 150 Å, and in particular aspects the combined thickness will be from about 25 Å to about 80 Å.

In the shown aspect of the invention, layer 36 is physically in contact with conductive material 34, and is also physically in contact with the dielectric material 38. In other words, first dielectric material 36 comprises a pair of opposing surfaces, with one of the opposing surfaces being physically against the conductively-doped semiconductive material of layer 34, and the other being physically against the metal oxide of second dielectric layer 38.

A conductive material 40 is formed over and in physical contact with second dielectric layer 38. Conductive material 40 can comprise one or more metals, and in particular aspects of the invention will comprise a metal compound, such as, for example, a metal nitride. Layer 40 can, for example, comprise, consist essentially of, or consist of titanium nitride.

A second conductive material 42 is formed over conductive material 40. Second conductive material 42 can comprise an appropriate metal, metal compound, and/or conductively-doped semiconductor material. In particular aspects of the invention, layer 42 will comprise, consist essentially of, or consist of tungsten. In other aspects, layer 42 will comprise a layer of conductively-doped silicon and a layer of tungsten, with the conductively-doped silicon being between the tungsten and a metal nitride (such as titanium nitride) of layer 40.

Layers 32, 34, 36, 38, 40 and 42 together form a capacitor construction 44. Specifically, conductive materials 32 and 34 form a first capacitor electrode, conductive materials 40 and 42 form a second capacitor electrode, and dielectric materials 36 and 38 separate the first and second capacitor electrodes from one another.

Capacitor 44 is electrically connected to the source/drain region 26, and is thus connected to one of the source/drain regions of a transistor construction. The other source/drain region 28 of the transistor construction is electrically connected with a bitline 46. Capacitor 44 can be utilized as a memory storage device of a dynamic random access memory (DRAM) cell and can be accessed through wordline 16 and bitline 46. A plurality of DRAM cells of the type described in FIG. 1 can be utilized together as a DRAM array.

Figure 1:
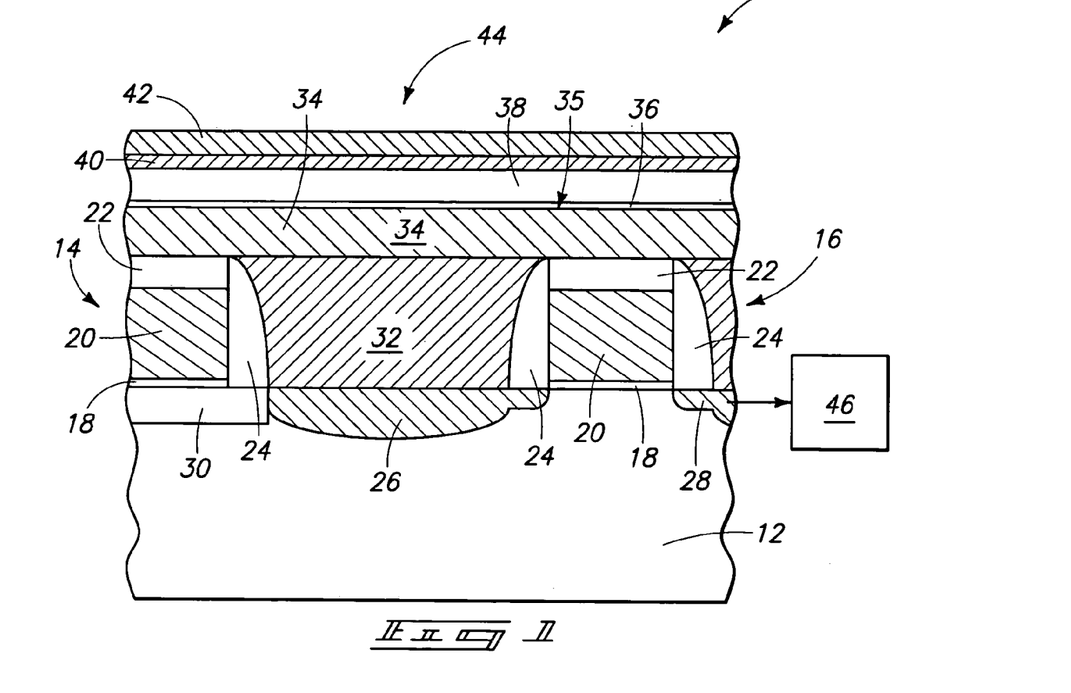
FIG. 1 is a diagrammatic, cross-sectional view of a semiconductor wafer fragment illustrating an exemplary device of an aspect of the present invention.

The construction of FIG. 1 is but one of many constructions that can be formed in accordance with aspects of the present invention. The shown capacitor is an exemplary capacitor, and it is to be understood that the capacitor can be formed in numerous other shapes. Also, it is to be understood that even though the shown capacitor only comprises two dielectric layers between the first and second capacitor electrodes, the invention encompasses other aspects (described below with reference to FIG. 6) in which multiple dielectric materials are provided between first and second capacitor electrodes. Also, even though the invention is described with reference to formation of capacitor structures, it is to be understood that various aspects of the invention can be utilized in other constructions besides capacitor structures.

Figure 2:
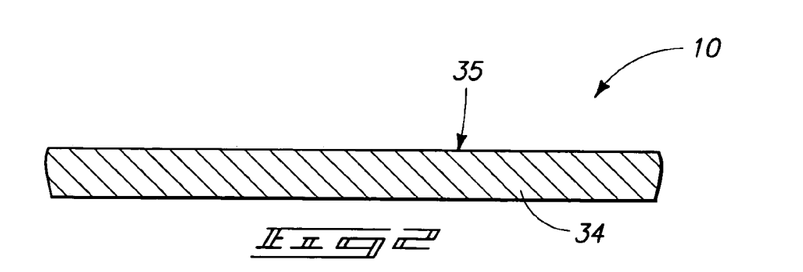
FIG. 2 is a diagrammatic, cross-sectional view of a portion of the FIG. 1 device shown at a preliminary processing stage of an exemplary aspect of the present invention.

A method of forming the capacitor construction of FIG. 1 is described with reference to FIGS. 2–5. Referring initially to FIG. 2, the capacitor electrode 34 of construction 10 is illustrated at a preliminary processing stage. The capacitor electrode 34 is shown in isolation in FIG. 2, rather than in combination with the other structures of FIG. 1, to simplify the drawing. It is to be understood, however, that the electrode can be supported by the semiconductor substrate 12 described above with reference to FIG. 1.

First capacitor electrode 34 comprises an upper surface 35 containing conductively-doped semiconductive material. In particular aspects, the upper surface will comprise, consist essentially of, or consist of conductively-doped silicon.

Figure 3:
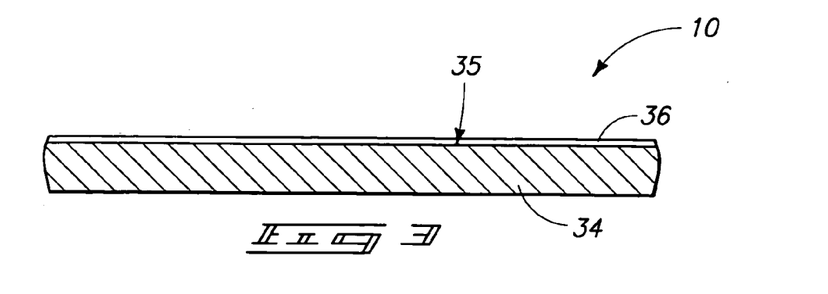
FIG. 3 is a view of the FIG. 2 portion shown at a processing stage subsequent to that of FIG. 2.

Referring to FIG. 3, the first dielectric layer 36 is formed over capacitor electrode 34, and specifically is formed in physical contact with upper surface 35 of the capacitor electrode. First dielectric material 36 comprises, consists essentially of, or consists of aluminum oxide, and can be formed by, for example, chemical vapor deposition (CVD) and/or atomic layer deposition (ALD).

Figure 4:
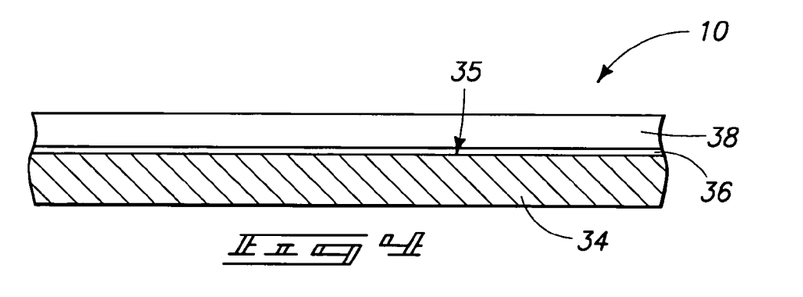
FIG. 4 is a view of the FIG. 2 portion shown at a processing stage subsequent to that of FIG. 3.

Referring to FIG. 4, the second dielectric layer 38 is formed over the first dielectric layer 36. Second dielectric layer 38 can comprise, consist essentially of, or consist of one or more of hafnium oxide, tantalum oxide and zirconium oxide. Second dielectric material 38 can be formed utilizing CVD and/or ALD.

In particular aspects of the invention, layers 36 and 38 are formed in a deposition process utilizing a common deposition chamber, and without breaking vacuum to the chamber between the deposition of first dielectric layer 36 and the deposition of the second dielectric layer 38. In other aspects of the invention, layers 36 and 38 are formed in separate deposition processes, and specifically, a vacuum to a chamber utilized for forming first dielectric layer 36 is broken prior to forming second dielectric layer 38.

Figure 5:
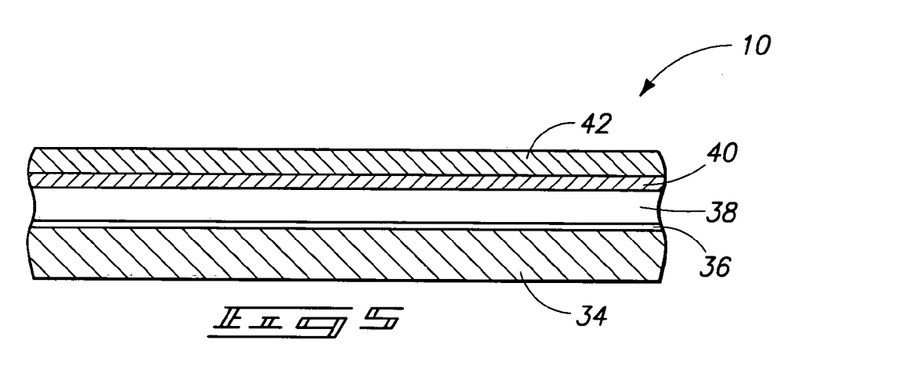
FIG. 5 is a view of the FIG. 2 portion shown at a processing stage subsequent to that of FIG. 4.

Referring to FIG. 5, the conductive materials 40 and 42 are formed over second dielectric layer 38. Such can be accomplished by, for example, utilizing one or more of ALD, CVD and physical vapor deposition (PVD)

Figure 6:
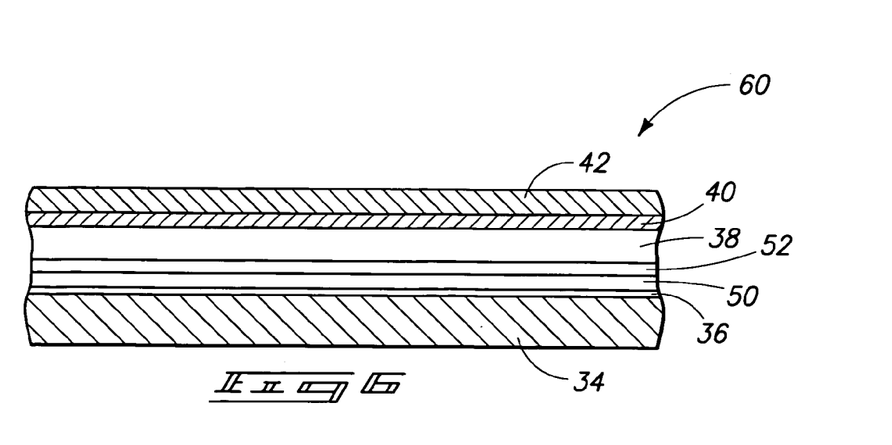
FIG. 6 is a diagrammatic, cross-sectional view of a semiconductor device illustrating an exemplary aspect of the invention alternative to that of FIG. 1.

The structures shown thus far have utilized layers 36 and 38 as the only dielectric materials between a first capacitor electrode and a second capacitor electrode. FIG. 6 illustrates another aspect of the invention, and specifically shows a structure 60 in which dielectric materials 50 and 52 are included between capacitor electrodes 34 and 40 in addition to the above-discussed dielectric materials 36 and 38. It is desired that the dielectric material 36 containing aluminum oxide is in physical contact with capacitor electrode 34.

FIG. 6 shows that additional dielectric materials can be provided between metal oxide-containing dielectric material 38 and aluminum oxide-containing dielectric material 36. In particular aspects of the invention, the various dielectric layers can comprise repeating stacks of an aluminum oxide-containing layer and a layer containing one or more of hafnium oxide, tantalum oxide and zirconium oxide. For instance, layer 50 can have the same composition as layer 38, and layer 52 can have the same composition as layer 36. Layers 50 and 52 can, in other aspects of the invention, comprise entirely different dielectric materials than those utilized in layers 36 and 38. The invention can comprise any desired number of dielectric layers in addition to layers 36 and 38, and the additional layers can have any suitable composition to achieve a desired thickness and/or capacitance.

Although layer 38 is shown in physical contact with conductive layer 40 of the second capacitor electrode in the aspects of the invention shown in the accompanying figures, it is to be understood that layer 38 can be spaced from the capacitor electrode by other dielectric materials in various aspects of the invention (not shown).

Figure 7:
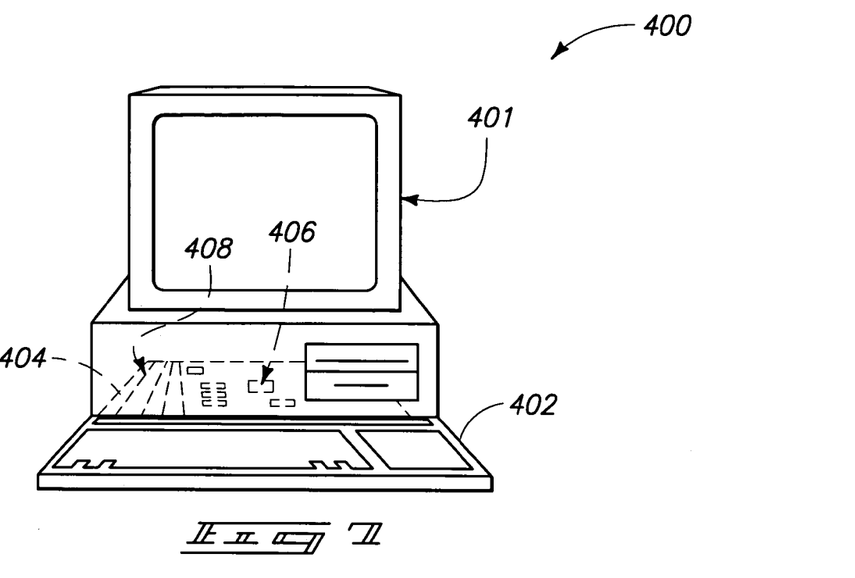
FIG. 7 is a diagrammatic view of a computer illustrating an exemplary application of the present invention.

FIG. 7 illustrates generally, by way of example but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 8. In such block diagram, the addressing circuitry is illustrated as 410 and the read circuitry is illustrated as 412. Various components of computer system 400, including processor 406, can comprise one or more of the memory constructions described previously in this disclosure.

Figure 8:
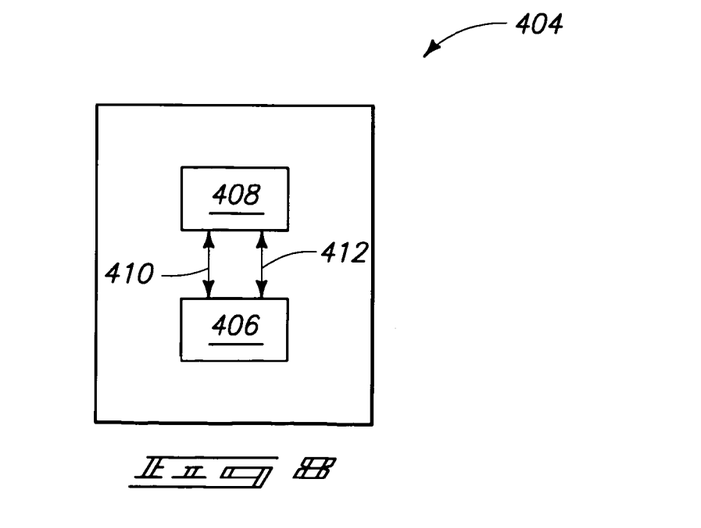
FIG. 8 is a block diagram showing particular features of the motherboard of the FIG. 7 computer.

Processor device 406 can correspond to a processor module, and associated memory utilized with the module can comprise teachings of the present invention.

Memory device 408 can correspond to a memory module. For example, single in-line memory modules (SIMMs) and dual in-line modules (DIMMs) may be used in the implementation which utilize the teachings of the present invention. The memory device can be incorporated into any of a variety of designs which provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory which allows data stored at a memory array address to be available as output after the addressed column has been closed. This memory can increase some communication speeds by allowing shorter access signals without reducing the time in which memory output data is available on a memory bus. Other alternative types of devices include SDRAM, DDR SDRAM, SLDRAM, VRAM and Direct RDRAM, as well as others such as SRAM or Flash memories.

Memory device 408 can comprise memory formed in accordance with one or more aspects of the present invention.

Figure 9:
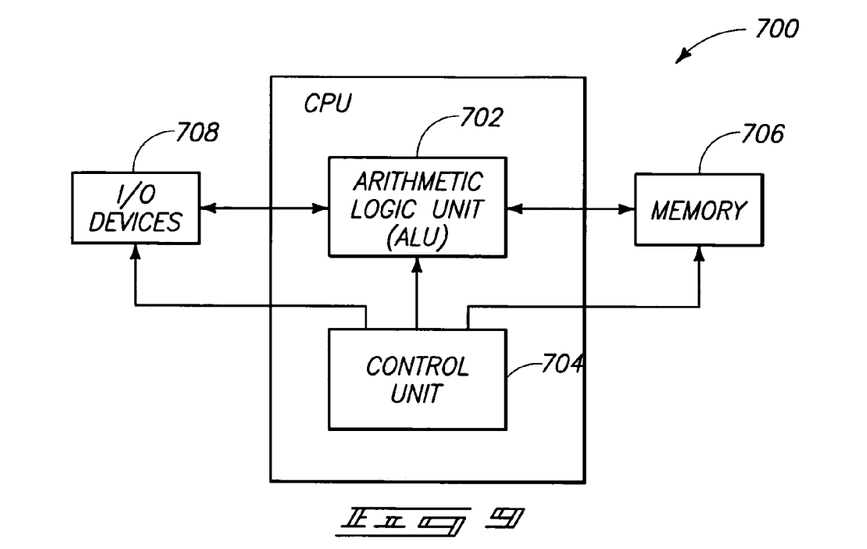
FIG. 9 is a high-level block diagram of an electronic system according to an exemplary aspect of the present invention.

FIG. 9 illustrates a simplified block diagram of a high-level organization of various embodiments of an exemplary electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by the processor 702 and other interactions between the processor 702, the memory device unit 706 and the I/O devices 708. The control unit 704 coordinates all operations of the processor 702, the memory device 706 and the I/O devices 708 by continuously cycling through a set of operations that cause instructions to be fetched from the memory device 706 and executed. In various embodiments, the memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include memory constructions in accordance with various aspects of the present invention.

Figure 10:
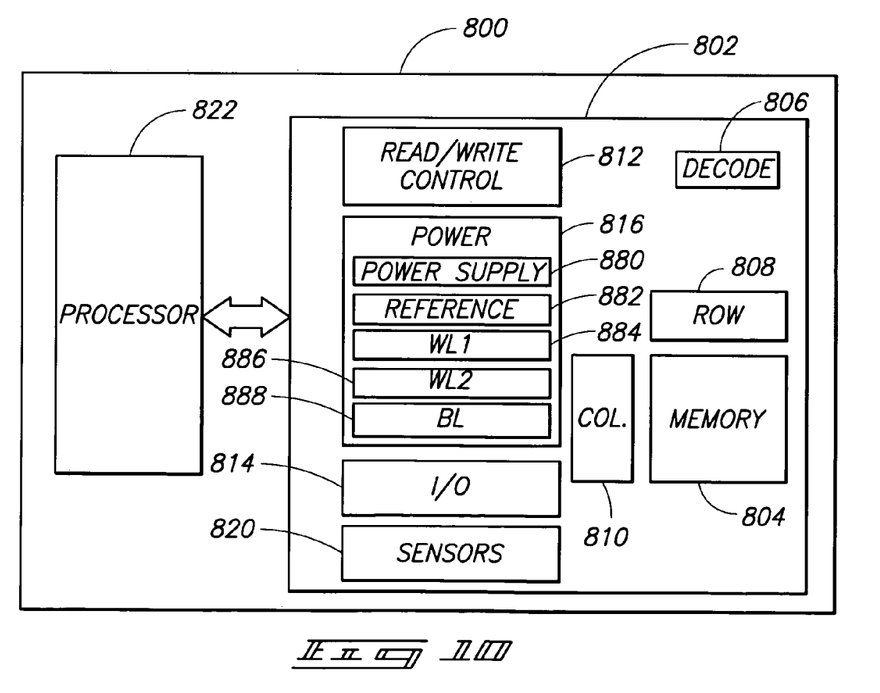
FIG. 10 is a simplified block diagram of an exemplary memory device according to an aspect of the present invention.

FIG. 10 is a simplified block diagram of a high-level organization of various embodiments of an exemplary electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first wordline with pulses, circuitry 886 for providing the second wordline with pulses, and circuitry 888 for providing the bitline with pulses. The system 800 also includes a processor 822, or memory controller for memory accessing.

The memory device 802 receives control signals 824 from the processor 822 over wiring or metallization lines. The memory device 802 is used to store data which is accessed via I/O lines. It will be appreciated by those skilled in the art that additional circuitry and control signals can be provided, and that the memory device 802 has been simplified to help focus on the invention. At least one of the processor 822 or memory device 802 can include a memory construction of the type described previously in this disclosure.

The various illustrated systems of this disclosure are intended to provide a general understanding of various applications for the circuitry and structures of the present invention, and are not intended to serve as a complete description of all the elements and features of an electronic system using memory cells in accordance with aspects of the present invention. One of the ordinary skill in the art will understand that the various electronic systems can be fabricated in single-package processing units, or even on a single semiconductor chip, in order to reduce the communication time between the processor and the memory device(s).

Applications for memory cells can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

It is noted that relative elevational relationships are utilized to describe the locations of various features to one another (e.g., upward, downward, etc are utilized) within this disclosure. It is to be understood that such terms are used to express relative relations between the components only, and not to indicate a relationship of the components relative to an external frame of reference. Thus, for example, a feature described herein as projecting upwardly relative to another feature may in fact appear to extend downwardly to a viewer in an external frame of reference relative to the feature.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A semiconductor construction comprising:
   a substrate;
   a pair of wordlines supported by the substrate; the wordlines each comprising a gate dielectric, an electrically conductive material and an electrically insulating cap; the electrically insulative caps of the wordlines having uppermost surfaces;
   a source/drain region within the substrate between the wordlines, the source/drain region being electrically isolated from one of the wordlines and being part of a transistor comprising a gate contained by the other of the wordlines;
   an electrically conductive pedestal between the wordlines, over the source/drain region, and electrically connected with the source/drain region; the electrically conductive pedestal having an uppermost surface; the uppermost surface of the conductive pedestal and the uppermost surfaces of the electrically insulative caps of the wordlines together forming a planar platform extending across the wordlines and the electrically conductive pedestal;

a first capacitor electrode over the planar platform and having a planar surface of conductively-doped silicon;

a planar second capacitor electrode over the first capacitor electrode planar surface and comprising one or more materials selected from the group consisting of metals and metal compounds;

a planar first dielectric layer between the first and second capacitor electrodes, the first dielectric layer comprising aluminum oxide;

a planar second dielectric layer between the first and second capacitor electrodes, the second dielectric layer comprising a metal oxide other than aluminum oxide;

wherein the first dielectric layer is between the second dielectric layer and the conductively-doped silicon; and wherein the metal oxide of the second dielectric layer is in physical contact with the second capacitor electrode.

2. The semiconductor construction of claim 1 further comprising one or more additional dielectric layers between the first and second capacitor electrodes besides the first and second dielectric layers.

3. The semiconductor construction of claim 1 wherein the first and second dielectric layers are the only dielectric layers between the first and second capacitor electrodes.

4. The semiconductor construction of claim 3 wherein the first and second dielectric layers have a combined thickness of from about 25 Å to about 150 Å.

5. The semiconductor construction of claim 4 wherein the first dielectric layer has a thickness of from about 5 Å to about 60 Å.

6. The semiconductor construction of claim 4 wherein the second dielectric layer has a thickness of from about 20 Å to about 90 Å.

7. The semiconductor construction of claim 3 wherein the first and second dielectric layers have a combined thickness of from about 25 Å to about 80 Å.

8. The semiconductor construction of claim 7 wherein the first dielectric layer has a thickness of from about 5 Å to about 20 Å.

9. The semiconductor construction of claim 7 wherein the second dielectric layer has a thickness of from about 20 Å to about 60 Å.

10. The semiconductor construction of claim 1 wherein the metal oxide of the second dielectric layer is selected from the group consisting of hafnium oxide, tantalum oxide and zirconium oxide.

11. The semiconductor construction of claim 10 wherein the second dielectric layer consists essentially of hafnium oxide.

12. The semiconductor construction of claim 10 wherein the second dielectric layer consists of hafnium oxide.

13. The semiconductor construction of claim 10 wherein the second dielectric layer consists essentially of tantalum oxide.

14. The semiconductor construction of claim 10 wherein the second dielectric layer consists of tantalum oxide.

15. The semiconductor construction of claim 10 wherein the second dielectric layer consists essentially of zirconium oxide.

16. The semiconductor construction of claim 10 wherein the second dielectric layer consists of zirconium oxide.

17. The semiconductor construction of claim 1 wherein the aluminum oxide of the first dielectric layer is physically against the conductively-doped silicon of the first capacitor electrode.

18. The semiconductor construction of claim 1 wherein:

the first dielectric layer consists of aluminum oxide;

the first dielectric layer has a pair of opposing surfaces;

one of the opposing surfaces of the first dielectric layer is physically against the conductively-doped silicon surface of the first capacitor electrode; and the other of the opposing surfaces of the first dielectric layer is physically against the metal oxide of the second dielectric layer.

19. The semiconductor construction of claim 18 wherein the first dielectric layer has a thickness between the opposing surfaces of from about 5 Å to about 20 Å.

20. The semiconductor construction of claim 18 wherein the second dielectric layer consists of hafnium oxide.

21. The semiconductor construction of claim 18 wherein the second dielectric layer consists of tantalum oxide.

22. The semiconductor construction of claim 18 wherein the second dielectric layer consists of zirconium oxide.

* * * * *

UNITED STATES PATENT AND TRADEMARK OFFICE
CERTIFICATE OF CORRECTION

PATENT NO. : 7,115,929 B2 Page 1 of 1
APPLICATION NO. : 10/822062
DATED : October 3, 2006
INVENTOR(S) : Bhat et al.

It is certified that error appears in the above-identified patent and that said Letters Patent is hereby corrected as shown below:

Col. 2, line 36 –
  Replace "utilizationas"
  With --utilization as--

Signed and Sealed this

Third Day of July, 2007

JON W. DUDAS
*Director of the United States Patent and Trademark Office*